United States Patent [19]

Huang

[11] Patent Number: 4,609,838
[45] Date of Patent: Sep. 2, 1986

[54] PROGRAMMABLE ARRAY COMBINATORIAL (PAC) CIRCUITRY

[75] Inventor: Eddy C. Huang, San Jose, Calif.

[73] Assignee: VLSI Technology, Inc., San Jose, Calif.

[21] Appl. No.: 615,295

[22] Filed: May 30, 1984

[51] Int. Cl.[4] .......................................... H03K 19/173
[52] U.S. Cl. .................................. 307/465; 307/469; 307/471; 307/579
[58] Field of Search ............... 307/443, 452, 453, 465, 307/468, 469, 471, 577, 579, 291; 364/716

[56] References Cited

U.S. PATENT DOCUMENTS

| | | | |
|---|---|---|---|
| 4,233,524 | 11/1980 | Burdick | 307/468 |
| 4,399,377 | 8/1983 | Jones | 307/443 X |
| 4,541,067 | 9/1985 | Whitaker | 307/471 X |

OTHER PUBLICATIONS

Mead & Conway, Introduction to VLSI Systems, Addison-Wesley Pub. Co., Reading, Mass., Oct. 1980, pp. 150-156.

Primary Examiner—Stanley D. Miller
Assistant Examiner—D. R. Hudspeth
Attorney, Agent, or Firm—Flehr, Hohbach, Test, Albritton & Herbert

[57] ABSTRACT

A plurality of product terms from an array of signals are combined by programmable array combinatorial (PAC) circuitry thereby permitting a variety of logic functions on the product terms. The PAC circuitry includes logic means for receiving first and second product terms and providing an output signal representing the first input, an OR function of the first and second inputs, or an exclusive OR function of the first and second inputs. The PAC circuitry can further include a shift register for providing a clock output signal. Inverter circuitry can be provided which responds to the control signals for inverting the output signal. The PAC circuitry is simple and readily implemented in a semiconductor integrated circuit thereby providing cost efficiency.

7 Claims, 5 Drawing Figures

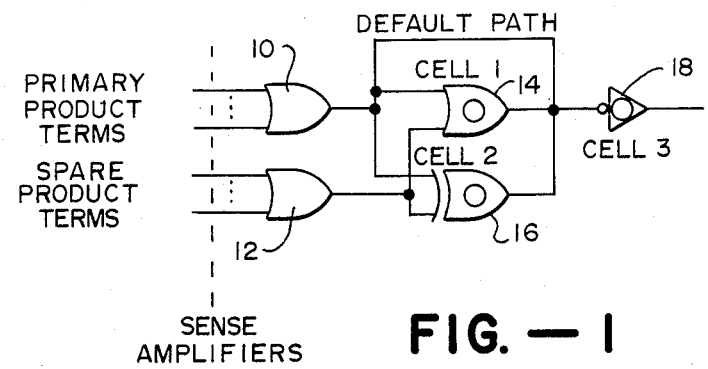
FIG.—1
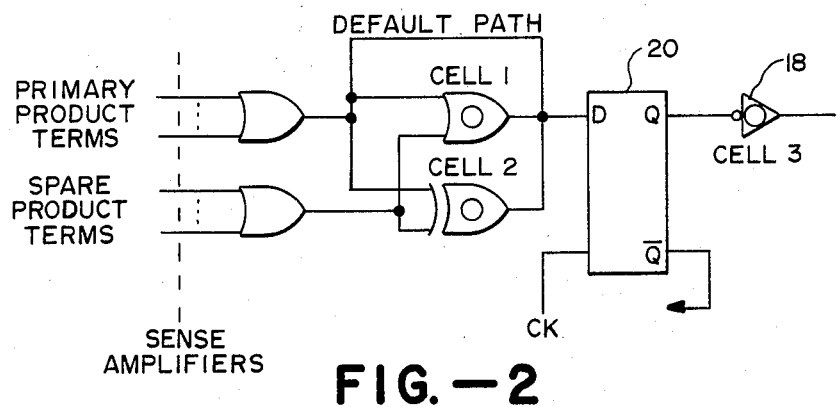
FIG.—2
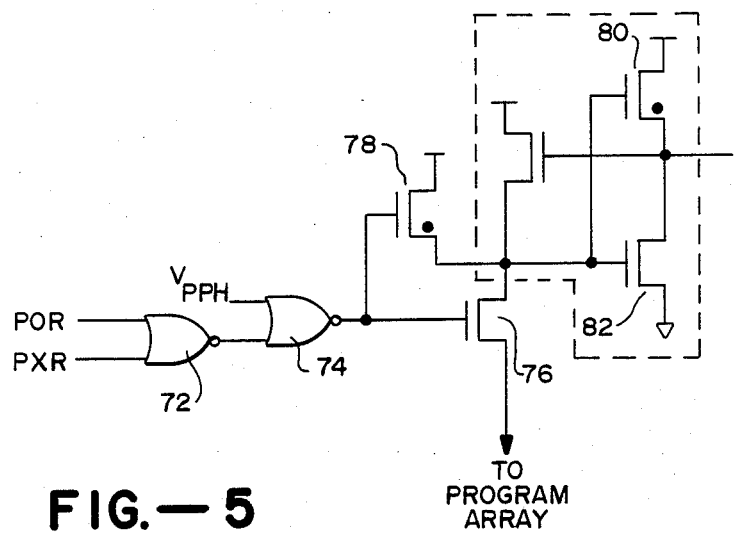
FIG.—5

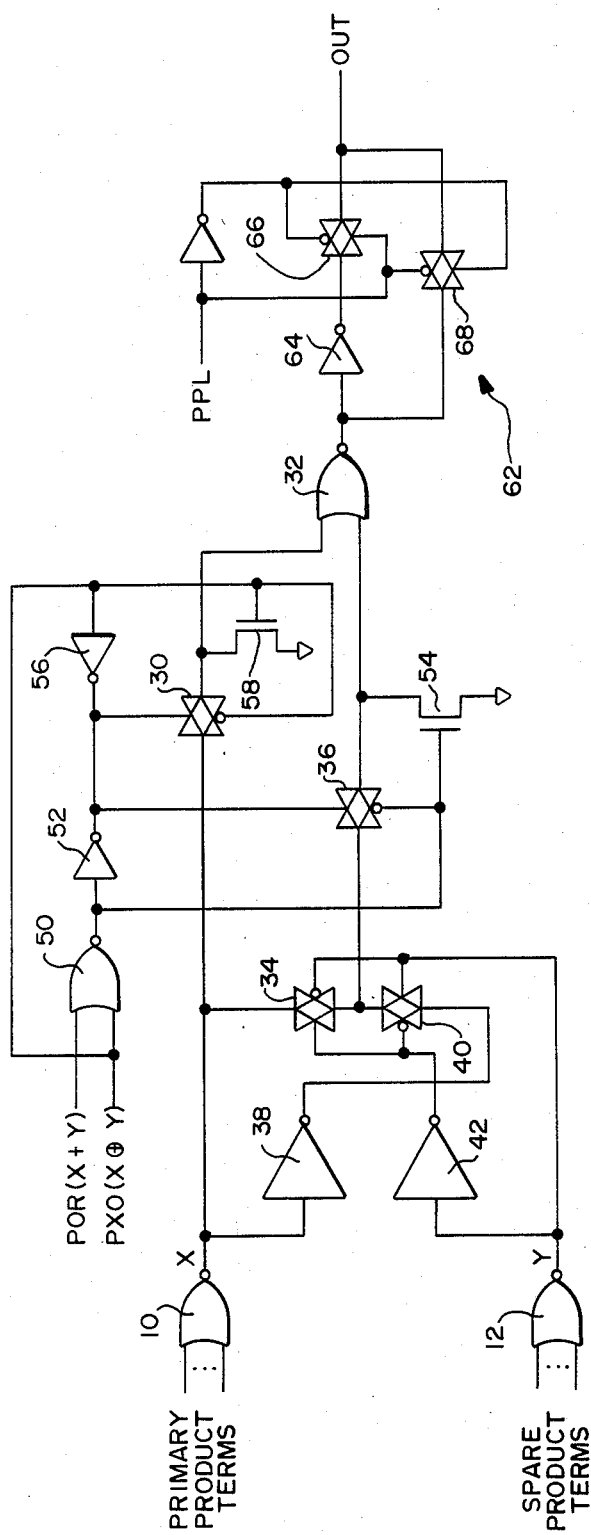
FIG.—3
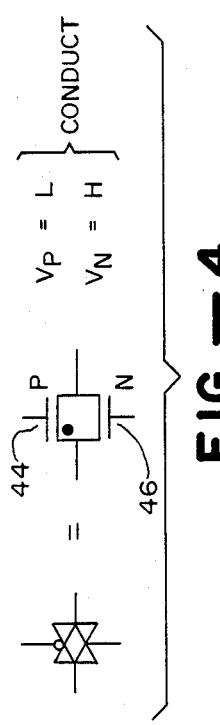
FIG.—4

PROGRAMMABLE ARRAY COMBINATORIAL (PAC) CIRCUITRY

This invention relates generally to programmable logic circuitry, and more particularly the invention relates to circuitry which is flexible in application and efficient in circuit implementation.

Integrated semiconductor circuits which offer programming flexibility are known. The mask programmable logic array (PLA) and the field programmable logic array (FPLA) offer circuit flexibility but require complex circuitry which is not cost effective. The PLA comprises an array of logical AND/OR gates which can be programmed by mask during manufacture or by fusible links for a specific function in random logic networks, data routing, code converters, decoders, and the like.

The programmable array logic (PAL) was introduced to improve cost effectiveness but has substantially less flexibility in use. As described in U.S. Pat. No. 4,124,899, the PAL comprises a matrix of circuit inputs and the inputs to a plurality of AND gates. Outputs from subgroups of AND gates are non-programmably connected as inputs to individual, specific OR gates.

The present invention provides more flexibility in application than does the PAL yet requires less semiconductor chip space than the PLA, thus offering increased cost effectiveness.

Briefly, programmable array combinatorial (PAC) circuitry is connected to receive groups of product terms and selectably operates on the product terms. More particularly, the PAC provides OR, EXCLUSIVE OR, or DEFAULT paths for the plurality of product terms including primary product terms and spare product terms. In the default mode only the primary product term is utilized, and power to the sense amplifiers for the spare product terms is removed.

Accordingly, an object of the invention is improved programmable logic circuitry.

A feature of the invention is the provision of OR, EXCLUSIVE OR, and DEFAULT paths for a plurality of product terms.

The invention and objects and features thereof will be more readily apparent from the following detailed description and appended claims when taken with the drawings, in which:

FIG. 1 is a schematic of programmable array circuitry in accordance with the invention.

FIG. 2 is a schematic of an alternative embodiment of programmable array circuitry including a registered output in accordance with the invention.

FIG. 3 is a more detailed schematic of the circuitry of FIG. 1.

FIG. 4 is a schematic of a transmission gate as used in the circuitry of FIG. 3.

FIG. 5 is a schematic of circuitry for removing power from spare product terms sense amplifiers when in the default mode of operation.

Referring now to the drawings, FIG. 1 is a schematic of PAC circuitry in accordance with the invention. The PAC circuitry receives and selectively acts on product terms from an EPROM or other array of programmable logic circuitry (not shown). Primary product terms are applied through OR gate 10 as one input to the PAC circuitry and spare product terms are applied through OR gate 12 as a second input to the PAC circuitry. The PAC circuitry includes OR gate 14 and exclusive OR gate 16 having outputs connected to inverter 18. The outputs of OR gates 10 and 12 are connected as inputs to the OR gate 14 and exclusive OR gate 16, and a default path is provided for directly connecting the output of OR gate 10 to the input of inverter 18.

When neither gate 14 nor gate 16 is activated, the default path connects the primary product terms to the input of inverter 18. Activation of OR gate 14 provides an OR function for the outputs of gates 10 and 12, while activation of gate 16 provides the exclusive OR function for the outputs of gates 10 and 12 as inputs to inverter 18. Importantly, in the default mode circuitry is provided for deactivating the sense amplifiers for the spare product terms thereby reducing power in the circuitry.

FIG. 2 is an alternative embodiment of the invention which is similar to FIG. 1 but includes clocked register 20 between the outputs of the default path and the gates 14 and 16 and before the input of inverter 18. In this embodiment the outputs of the array circuitry can be clocked. Referring now to FIG. 3, a detailed schematic of the circuitry of FIG. 1 is illustrated. The output of gate 10 is connected through a transmission gate 30 to one input of NOR gate 32 during the default mode. The output of gate 10 is also connected through transfer gate 34 and transfer gate 36 to another input to NOR gate 32. Additionally, the output of NOR gate 10 is connected through inverter 38 and through transfer gates 40 and 36 to the input of NOR gate 32. Control of the transfer gates 34 and 40 is provided by the output of gate 12 which is connected directly to control terminals of gates 34 and 40 and is connected, also, through inverter 42 to the other control terminals of gates 34 and 40.

As is known in the art and as illustrated in FIG. 4, each transfer gate comprises a P channel enhancement transistor 44 and an N channel enhancement transistor 46 which are connected in parallel. The transfer gate is rendered conductive by applying a low voltage as a gate signal, $V_p$, to the gate of the P channel enhancement transistor while applying a high voltage as the control voltage, $V_n$, to the gate of the N channel enhancement transistor 46.

A program OR (POR) signal establishes the OR function while a program exclusive OR (PXO) signal is applied to program the exclusive OR function. When neither signal is present the PAC circuitry is in the default mode.

The POR and PXO signals are applied as inputs to NOR gate 50 with the output of NOR gate 50 being applied through inverter 52 as a control signal to the N channel enhancement mode transistor of transmission gate 36. The output of NOR gate 50 is applied directly as a control signal to the P channel enhancement mode transistor of transmission gate 36 and to the gate of N channel transistor 54 for enabling or disabling one input to NOR gate 32.

The PXO signal is applied also through inverter 56 to control the conductance of the N channel transistor and directly to the gate of the P channel transistor of the transmission gate 30. The PXO signal is applied also to the gate of transistor 58 which shunts one input to NOR gate 32 to ground.

In operation, when neither the POR signal nor the PXO signal is present, transmission gate 30 is conductive and allows the output of gate 10 to be applied to gate 32. The PAC circuitry responds solely to the output of gate 10.

When the POR signal is present transmission gates 30 and 36 will be conductive thereby applying the output of gate 10 and the output of the common terminal of transmission gates 34, 40 as inputs to gate 32. The output of gates 34, 40 is exclusively X or Y. Thus, AND gate 32 receives input X and input exclusively X or Y, which together is equivalent to X or Y.

When the PXO signal is present, transmission gate 30 is non-conductive and transistor 58 disables the X input to the NOR gate 32. Transmission gates 34, 36 and 40 are conductive; therefore, the exclusive X or Y input is applied to the other input to gate 32.

The output of gate 32 is applied through polarity circuitry shown generally at 62 which responds to the program polarity signal, PPL, to either invert the output of gate 32 by inverter 64 and to transmission gate 66, or alternatively not invert the signal by transmitting the signal directly through transmission gate 68 to the output terminal.

Importantly, when neither the POR signal nor the PXO signal are present and the spare product terms are not utilized the sense amplifiers associated with the spare product terms are deactivated by the removal of power through the circuitry illustrated in FIG. 5. The POR and PXO signals are applied to exclusive OR gate 72, and when neither signal is present gate 72 produces a "1" output. This output is applied to NOR gate 74 which produces a zero output. The zero output turns off transistor 76 thereby disconnecting the program array. Transistor 78 is turned on which in turn turns transistor 80 off and transistor 82 on. No current is then applied to the sense amplifiers for the spare product turns.

Conversely, when either the POR signal or the PXO signal is present, transistor 76 connects the sense amplifier to the program array, and current is provided through transistor 80 to the sense amplifier for the spare product turns.

By using the PAC circuitry to selectively connect the plurality of product terms as described, greater flexibility in a programmable logic array is provided. Further, the PAC cells are simple in circuitry and small in size thus permitting efficiency in circuit implementation. Use of the PAC cells with electrically programmable logic provides much greater flexibility than existing bipolar PAL circuits and offers simpler programming and size advantages over bipolar PAL circuitry.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. Programmable array combinatorial circuitry comprising
    first and second gates for respectively receiving primary product terms and spare product terms and producing first and second signals representing said primary product terms and said spare product terms,
    first and second input terminals for receiving said first and second signals, respectively, and
    logic means operably connected to said first and second terminals for receiving said first and second signals and responsive to control signals for providing an output signal representing said first signal, an OR function of said first and second signals, or an exclusive OR function of said first and second signals.

2. The circuitry of claim 1 and further including register means connected to receive said output signal.

3. The circuitry as defined by claim 2 and further including inverter circuitry connected to said register means and responsive to control signals for inverting said output signal.

4. Programmable array combinatorial circuitry comprising
    first and second input terminals for receiving first and second signals representing primary product terms and spare product terms, respectively,
    logic means operably connected to said first and second terminals for receiving said first and second signals and responsive to control signals for providing an output signal representing said first input signal, an OR function of said first and second input signals, or an exclusive OR function of said first and second input signals, and
    inverter circuitry connected to receive said output signal and responsive to control signals for inverting said output signal.

5. The circuitry as defined by claim 4 wherein said logic means includes a plurality of transmission gates controllably connected to receive said control signals.

6. The circuitry as defined by claim 5 wherein said control signals include an OR signal (POR) for said OR function, and exclusive OR signal (XOR) for said exclusive OR function, said output signal representing said first input signal in response to absence of both said OR signal and said exclusive OR signal.

7. The circuitry as defined by claim 4 and further including register means connected between said logic means and said inverter circuitry for receiving said output signal from said logic means and providing said output signal to said inverter circuitry.

* * * * *